United States Patent [19]

Chiu et al.

[11] Patent Number: 4,884,270
[45] Date of Patent: Nov. 28, 1989

[54] EASILY CASCADABLE AND TESTABLE CACHE MEMORY

[75] Inventors: Edison H. Chiu, Richardson; Roland H. Pang, Plano, both of Tex.

[73] Assignee: Texas Instruments Incorporated, Dallas, Tex.

[21] Appl. No.: 257,500

[22] Filed: Oct. 14, 1988

Related U.S. Application Data

[62] Division of Ser. No. 940,369, Dec. 11, 1986, Pat. No. 4,831,625.

[51] Int. Cl.⁴ .............................................. G06F 11/10
[52] U.S. Cl. ............................... 371/21.2; 371/51.1; 371/71; 365/189.07
[58] Field of Search ................ 371/51, 49, 71 X, 21, 371/25, 50; 364/200, 900

[56] References Cited

U.S. PATENT DOCUMENTS

| | | | |
|---|---|---|---|
| 3,944,800 | 3/1976 | Beck | 371/51 |
| 3,982,111 | 9/1976 | Lerner | 371/51 |
| 4,038,648 | 7/1977 | Chesley | 371/71 |
| 4,295,219 | 10/1981 | Draper | 371/51 |
| 4,355,393 | 10/1982 | Kubo | 371/51 |
| 4,483,003 | 11/1984 | Beal | 371/51 |
| 4,596,015 | 6/1986 | Clements | 371/51 |
| 4,653,055 | 3/1987 | Micic | 371/51 |
| 4,667,330 | 5/1987 | Kumagai | 371/71 |
| 4,692,893 | 9/1987 | Casper | 371/51 |

OTHER PUBLICATIONS

'Cache-Memory Functions Surface on VLSI Chip', Electronic Design, vol. 30, No. 4; Feb. 18, 1982, Copyright 1982, Hayden Publishing Co., Inc.

Primary Examiner—Michael R. Fleming
Attorney, Agent, or Firm—Thomas R. FitzGerald; Leo N. Heiting; Melvin Sharp

[57] ABSTRACT

The disclosure relates to a cache memory formed on a single chip wherein the ability to test the address comparator, cache memory diagnostics are improved, cache memory are capable of being read out. The architecture comprises a parity generator, a parity checker, a comparator and an SRAM memory call array. The cache memory is cascadable for access to an increased address range and to provide increased memory capacity.

12 Claims, 2 Drawing Sheets

EASILY CASCADABLE AND TESTABLE CACHE MEMORY

This is a division of application Ser. No. 940,369, filed Dec. 11, 1986, now U.S. Pat. No. 4,831,625.

BACKGROUND OF THE INVENTION

1. Field of the Invention

This invention relates to a single chip cache memory and, more specifically, to the architectural arrangement therefore to provide easy cascading and testing.

2. Description of the Prior Art

A cache memory is temporary storage device of small capacity relative to the main storage of a computer which is rapidly accessible and is normally positioned between the central processing unit (CPU) and the main memory. In conventional cache memory circuits, an SRAM is provided with, for example, 2K×8 storage locations. The memory includes address and data input lines, a chip select circuit, a read circuit and a write circuit. In this manner, data is written into or read from the addressed memory location when the appropriate chip select signal and read or write signal is provided. The prior art cache memory has no provision for comparison, parity generation, parity checking or reset.

An improved type of circuit is a cache address comparator of the type found in, for example, the TMS 2150 cache address comparator produced by Texas Instruments Incorporated. This cache address comparator does not contain a read function, thereby limiting the operations which it is capable of performing or which can be performed therein. Such prior art cache memories include an SRAM, parity generator and checker, comparator and reset circuit. These prior art comparators do not contain a read function. In addition, the comparators are difficult to cascade because they utilize NMOS to totem-pole and can not be ANDed with other similar circuits without the addition of a great deal of additional circuitry. This limits the ability to increase memory storage capability or to increase the range of addresses to which they may be capable of response. It is readily apparent that these deficiencies of the prior art severely limit the use of such cache address comparators.

It is therefore desireable to improve the cache memory or comparator capability relating to storage capacity as well as to address responsiveness. In addition, the prior art cache memories and comparators are difficult to test on-line. It is desirable that such memories be capable of rapid testing, on line, on a periodic basis, to insure proper operation thereof.

SUMMARY OF THE INVENTION

In accordance with the present invention, the above noted deficiencies in the prior art are minimized and there is provided a CMOS cache memory which is easily and readily testable on line and which is cascadable to increase the storage capability thereof as well as increasing the range of addresses to which it is responsive.

Briefly, in accordance with the present invention, the cache memory includes, in a single chip, a cache address and data comparator and SRAM features to allow the system to program cache memory instructions only, cache data only cache instructions and data or fixed SRAM memory. The architecture includes an SRAM (2K×9 in the preferred embodiment) and a cache comparator. The cache comparator comprises a parity generator, a parity checker and a comparator circuit. The cache memory is cascaded for for increased memory capacity and greater address range responsiveness. The functional structure of the SRAM is similar to that of static RAMs of conventional type, the SRAM having address decoders, memory read/write control, data input/output (I/O), and sense amplifiers which operate in the same manner as in conventional SRAMs.

DESCRIPTION OF THE PREFERRED EMBODIMENT

Figure 1:
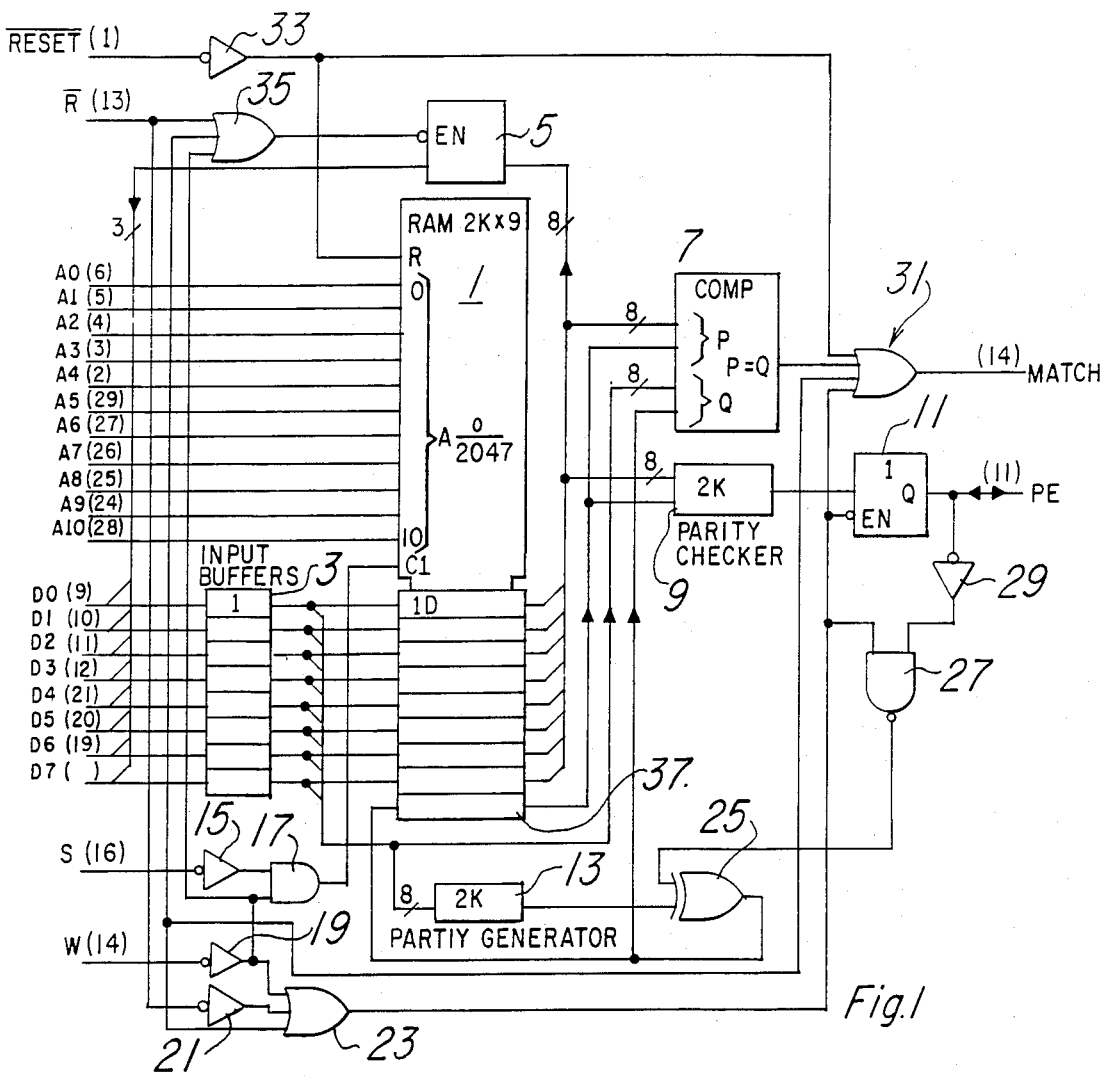
FIG. 1 is a block diagram of a cache memory in accordance with the present invention.
Figure 2:
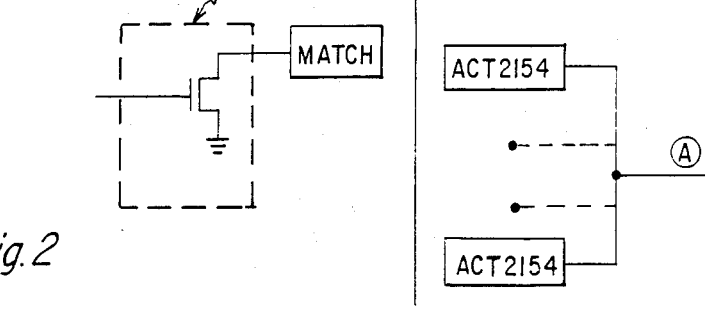
FIG. 2 is a circuit diagram of the open drain output portion to the MATCH line of the OR gate 31.

Referring now to FIG. 1, wherein positive logic is utilized, there is shown the CMOS cache memory in accordance with the present invention. The memory includes an SRAM 1 having a 9×2047 arrangement of memory cells in the preferred embodiment which is provided by way of example and not by way of limitation. The memory also has a plurality of address input A0 to A10 and a plurality of data inputs D0 to D7, the latter with intervening input buffers 3 on each data input line. The reset input passes through an inverter 33 to the RESET bar input of the SRAM 1 and to one of the inputs of OR gate 31. The OR gate 31 also includes as an input thereto the output of comparator 7, the S input and the output of OR gate 23. The output of OR gate 31 includes an open drain circuit as shown in FIG. 2 and, when there is a match in the comparator 7, as will be explained hereinbelow, provides a high output on the MATCH output line.

The OR gate 35 has, as inputs thereto, the R bar (read) input, the S bar (chip select) input and the inverted W (write) input which is provided through inverter 19. The output of OR gate 34 is an enable input to tri-state output buffer 5 which is controlled by gate 35 to enable operation thereof. This circuit also has the parallel eight data bit output of the SRAM 1 as an input thereto and provides a parallel eight bit output therefrom back to the data input lines D0 to D7. This signal goes directly onto the input lines D0 to D7. The OR gate 35 provides the control therefor. When the R bar signal is low, the data from the SRAM 1 travels directly onto the data buses D0 to D7. The eight bit parallel output of the SRAM 1 is also fed to the comparator 7 and to the parity checker 9.

The comparator 7 includes, as inputs thereto, the above noted eight bit parallel output of the SRAM 1, the output of the parity bit portion of the SRAM 1, the eight bit parallel output of the input buffers 3 and the output of the exclusive OR gate 25. The output from comparator 7, as noted above, is an input to the OR gate 31. The comparator 7 compares the output of the SRAM 1 with the input thereto as well as the parity bit at those locations to determine whether there is a match.

The parity checker 9 receives, as inputs thereto, the eight bit parallel output of the SRAM 1 and the output of the parity bit portion of the SRAM 1. From this data, the parity checker determines what the parity should be and provides an output indicative thereof to the tri-state open drain buffer 11 controlled by OR gate 23. The buffer 11, is enabled by the output of OR gate 23, previously discussed. The buffer 11 provides a parity enable bar (PE) signal indicative of the state of the parity signal and also sends an inverted PE bar signal via inverter 29 to NAND gate 27. The other input to NAND gate 27 is the output of OR gate 23 previously discussed. The output of NAND gate 27 is one of the inputs to the exclusive OR gate 25 as previously noted.

The OR gate 23 includes, as inputs thereto, the W bar input inverted by inverter 19, the R bar input inverted by inverter 21 and the S bar input. The AND gate 17 has, as inputs thereto, the S bar input inverted by inverter 15 and the W bar input inverted by inverter 19. The output of AND gate 17 is an input at the C1 input of the SRAM 1. The C1 input of the SRAM 1 is the chip enable signal input for the chip itself. When the S bar input is low, then SRAM 1 will be enabled. If the S bar input is high, SRAM 1 is disabled which causes that chip to be disabled.

The parity generator 13 receives, as its input, the eight parallel output signals of the input buffers 3 and, after determining the parity thereof, provides an output indicative of the sensed parity to the exclusive OR gate 25 as an input thereto as discussed hereinabove.

The operation of the above described cache memory is carried out as follows:

When the S bar input is low and the W bar input and R bar input are both high, the cache address memory compares, in the comparator 7, the contents of the addressed memory location including the stored parity bit in the cell of the SRAM 1 being addressed on the address inputs A0 to A10 with the data on the data input D0 to D7 plus the parity signal generated by the parity generator 13 and the exclusive OR gate 25. An equality or match in the comparison that takes place in the comparator 7 is indicated by a high level on the match output from the OR gate 31 which is provided by comparing, in the comparator 7, the outputs of the input buffers 3 with the output of the SRAM 1 as well as the parity signal provided from the parity generator 13 and exclusive OR gate 25 with the parity signal at the output of the SRAM 1. A high output from the comparator 7 is provided in the case of match to provide the high on the match output of the OR gate 31. It should be noted that the match output is taken from an open drain output buffer as described hereinabove.

The parity checker 9 compares the parity signal on the parity output with the parity determined from the signals on the data outputs of the SRAM 1. If the parity signal received and the parity of the inputed data match then a high signal is provided to the circuit 11 to provide a high on the PE bar output. A low level output on the PE bar output of the circuit 11 indicates a parity error in the internal RAM data. The PE bar signal will determine the ultimate parity signal fed back to the input of the SRAM 1. The PE bar signal is fed back to the input only when the W bar signal is low (write cycle) and the R bar input is low (read cycle) and the S bar input is low (chip enable).

During a write cycle, the S bar and W bar inputs are low and data on the data input lines D0 to D7 as well as generated even parity are written into the nine bit memory location addressed by addess inputs A0 to A10. During a write cycle, a parity error may be forced by holding the PE bar signal low.

A read mode is provided with the cache memory which allows the contents of the RAM to be read at the data buses D0 to D7. The read mode is selected when the R bar input is low, the W bar input is high and the S bar input is low. A reset input is provided for initialization of the circuit prior to operation. When the RESET bar input goes low, all of the storage locations in the SRAM 1 are cleared to zero and the match output is forced high.

Figure 3:
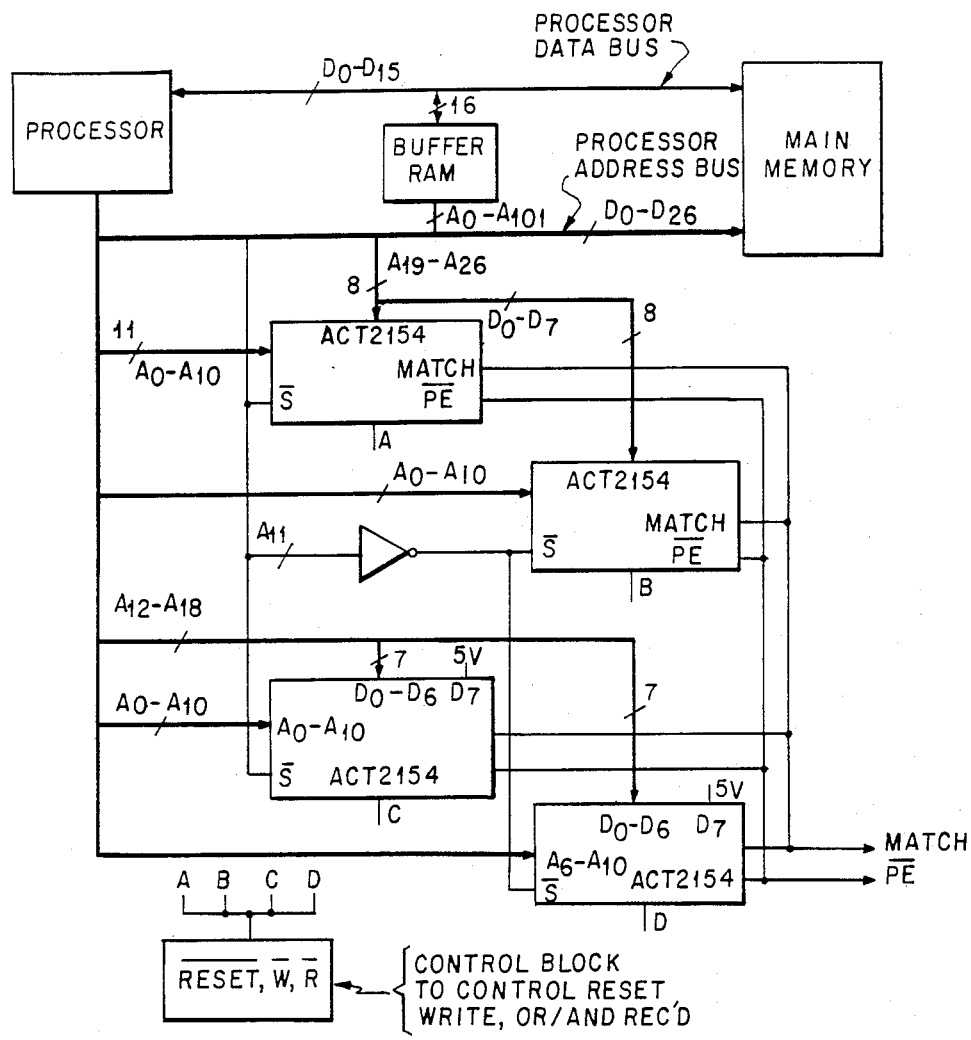
FIG. 3 is a schematic diagram of the expansion of the circuit of FIG. 1 to include more memory and responsiveness to a wider range of addresses.

Referring now to FIG. 3, there is shown a circuit arrangement wherein a plurality of chips of the type described with respect to FIGS. 1 and 2 are arranged in a circuit to provide expanded memory as well as accessability to a larger or wider number of addresses as compared with the single chip. The circuit includes four cache memory chips, A, B, C and D, each chip having an eleven line address input, an eight line data input, match and parity enable outputs, reset bar, write bar and read bar inputs and a chip enable input. The reset bar, write bar and read bar inputs are received from an external control block which forms no part of this invention and which are designated as input A to chip A, input B to chip B, input C to chip C and input D to chip D.

The chips A, B, C and D are disposed in a circuit between a processor and a main memory. A sixteen line processor data bus D0 to D15 is connected between the processor and the main memory. These sixteen data lines are also coupled to a buffer RAM which is part of the system memory configuration and not a part of one of the cache memory chips. The buffer stores the main memory instruction data and is controlled by the MATCH output whereby, on a match, the MATCH output is high and enables the buffer RAM. This then permits the data from the buffer RAM to pass on to the data bus. The buffer RAM forms no part of the present invention. A twenty seven line processor address bus A0 to A26 is also connected between the processor and the main memory. Twelve of these lines, A0 to A11 are coupled to the buffer RAM. In addition, eleven of the address lines A0 to A10 are coupled to the address inputs A0 to A10 of chips A, B, C and D. The chip select input S bar of each chip A, B, C and D receives its input from address line A11 directly at chips A and C or via in inverter at chips B and D. The selection of chips is determined by the signal on bus A11 which is fed from the processor address bus to each of the chips A, B, C and D to select the chip in which the addressed locations are to be utilized for the read, write or reset function. The processor address bus lines A12 to A18 are also directed to inputs on the chips C and D at data inputs D0 to D6 thereof whereas processor address bus lines A19 to A26 are directed to inputs on chips A and B at data inputs D0 to D7 thereof. The chips C and D have their data input D7 connected as the power input to force D7 high, thereby allowing a data word of all zeros compared to any memory location that has not been written into since reset and the MATCH output will be low, indicating that input data plus generated parity is not equal to the reset memory location. The setting of input D7 high is arbitrary and is used when the convention used is for a match to be indicated by a high signal on the MATCH output. The entire circuit arrangement includes a MATCH output and a PE bar output, the like named outputs of each of said chips as shown and explained in regard to the cache memory chip of FIG. 1 being directly coupled to these output buses.

FIG. 3 shows the expansion of the cache memory carried out in both depth (more sets) and width (wider address). The least significant address lines (A0 to A10) are used as the set select inputs to the cache memory and system buffer RAM. Set select determines, in the case where, for example, many sets of four chips as shown in FIG. 3 are provided, which set of four chips is to be accessed. The address line A11 is used as a word select. When address line A11 is high, chips A and C are selected. Since chips A and C are each 8 bits wide, sixteen bits (two eight bit data words) are now selected. When address line A11 is low, chips B and D are selected in the same manner. Therefore the top 2K blocks A and C (or B and D) of two words are selected (two cache memories, A and C in parallel—the memory depth is now 4K of memory). Address lines A12 to A18, A19 to A26 are also selected to provide the increased width at the address connection. If address line A11 is low, chips B and D are selected, the bottom 2k of 4K blocks of two words are selected. In the example, there are fifteen address lines A12 to A18, A19 to A26 which are the data inputs to the cache memory and the sixteenth data input to chips C and D, the D7 inputs, are tied to power (i.e., five volts) so that, after reset, invalid data cannot force a match. As can be seen, this arrangement provides both "depth" and "width" relative to the single chip embodiment of FIG. 1). It is apparent that, as the width of the address increases, more storage locations can be accessed on one pass, thereby permitting more data to be moved in one pass as opposed to the use of a narrower memory.

It is apparent from the above description relative to FIGS. 1 and 2 that there is provided a cache memory which overcomes the problems of prior art devices and which is cascadable as demonstrated in FIG. 3.

Though the invention has been described with respect to a specific preferred embodiment thereof, many variations and modifications will immediately become apparent to those skilled in the art. It is therefore the intention that the appended claims be interpretted as broadly as possible in view of the prior art to include all such variations and modifications.

We claim:

1. A single semiconductor chip cache memory comprising:
   (a) a SRAM having plural data inputs, plural address inputs, plural address locations for storing data and plural data outputs;
   (b) a comparator for comparing said data inputs stored at said addressed locations to provide a comparator output indicative of a match between input and stored data; and
   (c) an output transistor having three electrodes including first and second electrodes and a control electrode for selectively coupling together the first and second electrodes, said control electrode being coupled to the comparator output to control the coupling or uncoupling of the first and second terminals in response to the comparator output at the control terminal.

2. A cache memory as set forth in claim 1 wherein the transistor comprises a field effect transistor having a gate coupled to the output of the comparator and an open drain electrode.

3. A cache memory as set forth in claim 2 wherein the transistor source is connected to a reference voltage.

4. A cache memory as set forth in claim 1 further comprising a parity checker reponsive to the addressed stored data and to the input data for checking the parity of said stored data with said input data.

5. A cache memory as set forth on claim 4 further comprising a parity generator responsive to said data input for providing an output indicative of the parity thereof and a gate responsive to the output of said parity generator and the output of said parity checker to provide a parity input.

6. A cache memory as set forth in claim 5 wherein said gate is an exclusive OR circuit.

7. A cache memory system comprising:
   (a) a plurality of semiconductor cache memory chips, each of said chips comprising:
   (b) a SRAM having plural data inputs, plural address inputs, plural data locations and plural data outputs;
   (c) a comparator for comparing said data inputs to data stored at an addressed location to provide a comparator output indicative of a match in said comparator;
   (d) an output transistor having three electrodes including first and second electrodes and a control electrode for selectively coupling together the first and second electrodes, said control electrode being coupled to the comparator output to control the coupling or uncoupling of the first and second terminals in response to said comparator output at said control terminal;
   (e) a processor data bus coupled to the data inputs of each of said chips;
   (f) a processor address bus coupled to the data inputs of each of said chips;
   wherein said first or second electrodes are coupled together.

8. A cache memory as set forth in claim 7 wherein the transistor comprises a field effect transistor having a gate coupled to the output of the comparator and an open drain electrode.

9. A cache memory as set forth in claim 8 wherein the transistor source is connected to a reference voltage.

10. A cache memory as set forth in claim 7 further comprising a parity checker responsive to the addressed stored data and to the input data for checking the parity of said stored data with said input data.

11. A cache memory as set forth on claim 10 further comprising a parity generator responsive to said data input for providing an output indicative of the parity thereof and a gate responsive to the output of said parity generator and the output of said parity checker to provide a parity input.

12. A cache memory as set forth in claim 11 wherein said gate is an exclusive OR circut.

* * * * *